(12) United States Patent
Russell et al.

(10) Patent No.: US 12,267,015 B2
(45) Date of Patent: Apr. 1, 2025

(54) DRIVER CIRCUIT AND METHOD FOR PROVIDING A PULSE

(71) Applicant: ams-OSRAM International GmbH, Regensburg (DE)

(72) Inventors: Ann Russell, San Jose, CA (US); Joseph Gasiewicz, Commerce, MI (US); Syedhossein Mousavian, Ottawa (CA); Somayeh Abnavi, Ottawa (CA)

(73) Assignee: ams-OSRAM International GmbH, Regensburg (DE)

( * ) Notice: Subject to any disclaimer, the term of this patent is extended or adjusted under 35 U.S.C. 154(b) by 73 days.

(21) Appl. No.: 18/253,598

(22) PCT Filed: Nov. 20, 2020

(86) PCT No.: PCT/US2020/061409
§ 371 (c)(1),
(2) Date: May 19, 2023

(87) PCT Pub. No.: WO2022/108590
PCT Pub. Date: May 27, 2022

(65) Prior Publication Data
US 2024/0007101 A1    Jan. 4, 2024

(51) Int. Cl.
*H03K 17/687* (2006.01)
*G01S 7/484* (2006.01)
(Continued)

(52) U.S. Cl.
CPC ............ *H02M 3/158* (2013.01); *G01S 7/484* (2013.01); *H01S 5/0428* (2013.01);
(Continued)

(58) Field of Classification Search
None
See application file for complete search history.

(56) References Cited

U.S. PATENT DOCUMENTS 8,994,279 B2 *   3/2015   Raval ................ H02M 3/156
                                                     363/106
9,185,763 B2 *  11/2015   Lin .................... H05B 45/44
(Continued)

FOREIGN PATENT DOCUMENTS

CN        101953059 A     1/2011
CN        103582213 A     2/2014
(Continued)

OTHER PUBLICATIONS

International Search Report for International application No. PCT/US2020/061409, dated Aug. 17, 2021,12 pages (For Invormational purposes only).
(Continued)

*Primary Examiner* — Kenneth B Wells
(74) *Attorney, Agent, or Firm* — Viering, Jentschura & Partner mbB; Robert M Bilotta, Jr.

(57) ABSTRACT

A driver circuit may include a first inductor with a first terminal coupled to a first voltage terminal and a first switch with a first and a second terminal. The first terminal of the first switch may be coupled to a second terminal of the first inductor via a first node and the second terminal of the first switch may be coupled to a second voltage terminal. Moreover, the driver circuit may include a diode with a first terminal coupled to the first node, an output terminal, and a first capacitor with a first electrode coupled to a second terminal of the diode and a second electrode coupled to the output terminal.

14 Claims, 9 Drawing Sheets

(51) Int. Cl.
*H01S 5/042* (2006.01)
*H01S 5/40* (2006.01)
*H02M 3/158* (2006.01)
*H03K 17/16* (2006.01)
*H05B 45/325* (2020.01)

(52) U.S. Cl.
CPC ......... *H01S 5/4025* (2013.01); *H03K 17/162* (2013.01); *H03K 17/687* (2013.01); *H05B 45/325* (2020.01)

(56) References Cited

U.S. PATENT DOCUMENTS

| | | | |
|---|---|---|---|
| 9,214,783 B2 * | 12/2015 | Nomura | F21S 41/176 |
| 9,847,736 B2 * | 12/2017 | Grootjans | G01C 3/08 |
| 10,511,142 B2 * | 12/2019 | Crawford | H02M 3/156 |
| 10,531,527 B1 * | 1/2020 | Milanesi | H05B 45/375 |
| 10,734,896 B2 * | 8/2020 | Murakami | G05F 1/46 |
| 11,070,026 B2 * | 7/2021 | Kaymaksut | H01S 5/0428 |
| 11,075,502 B2 * | 7/2021 | Kuo | H01S 5/0608 |
| 11,387,624 B2 * | 7/2022 | Huang | G01S 7/4911 |
| 11,487,310 B2 * | 11/2022 | Murakami | H05B 45/3725 |
| 11,545,811 B2 * | 1/2023 | Avci | G01S 7/484 |
| 2010/0315048 A1 | 12/2010 | De Sousa et al. | |
| 2013/0272688 A1 | 10/2013 | Trattler | |
| 2014/0312233 A1 | 10/2014 | Mark et al. | |
| 2015/0036708 A1 | 2/2015 | Deppe | |
| 2019/0229493 A1 | 7/2019 | Stern | |
| 2021/0184574 A1 | 6/2021 | Fu et al. | |
| 2024/0007101 A1 | 1/2024 | Russell et al. | |

FOREIGN PATENT DOCUMENTS

| | | |
|---|---|---|
| CN | 106658880 A | 5/2017 |
| CN | 206412630 U | 8/2017 |
| CN | 110870185 A | 3/2020 |
| CN | 211152263 U | 7/2020 |
| CN | 118402183 A | 7/2024 |
| KR | 1020110022983 A | 3/2011 |
| KR | 101234366 B1 | 2/2013 |
| WO | 2018222630 A1 | 12/2018 |

OTHER PUBLICATIONS

International Search Report for international application No. PCT/US2021/060004, mailed on Mar. 14, 2022, 3 pages (For informational purposes only).

Analog Devices, Inc. Fixed Ratio High Power Inductorless (Charge Pump) DC/DC Controller, Data Sheet LTC7820, 2017, 28 pages.

Ann Russell et al., "Lasers for Lidar: Monolithic multichannel laser moves automotive lidar toward practical use", https://www.laserfocusworld.com/lasers-sources/article/14037941/monolithic-multichannel-laser-moves-automotive-lidar-toward-practical-use, retrieved from the internet on Sep. 30, 2020, 7 pages.

Chinese search report issued for the corresponding Chinese patent application No. 2020801082144, dated Dec. 12, 2024, 2 pages (for informational purposes only).

* cited by examiner

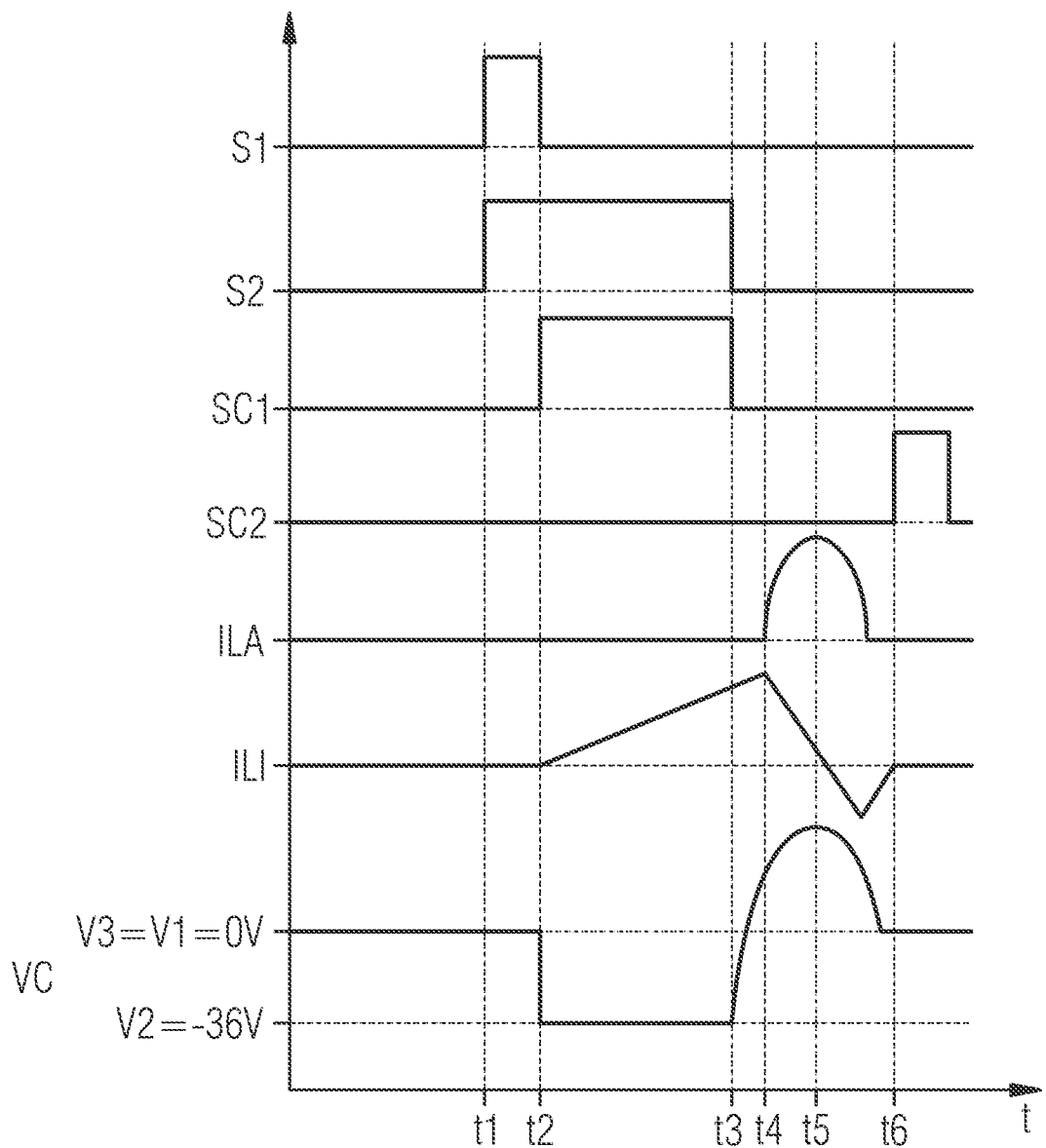

DRIVER CIRCUIT AND METHOD FOR PROVIDING A PULSE

CROSS-REFERENCE TO RELATED APPLICATIONS

The present application is a national stage entry according to 35 U.S.C. § 371 of PCT application No.: PCT/US2020/061409 filed on Nov. 20, 2020, which is incorporated herein by reference in its entirety and for all purposes.

TECHNICAL FIELD

A driver circuit, an optical circuit with a driver circuit and a method for providing a pulse are provided.

BACKGROUND

A driver circuit often includes a voltage converter that converts an input voltage into an output voltage. An optical circuit may include a laser. For emitting a flash by the laser, a constant output voltage of the voltage converter may not be appropriate.

It is an objective to provide a driver circuit, an optical circuit with the driver circuit and a method for providing a pulse which is suited for generating an appropriate output voltage.

SUMMARY

According to an embodiment, a driver circuit comprises a first inductor with a first and a second terminal, a first switch with a first and a second terminal, a diode with a first and a second terminal, an output terminal and a first capacitor with a first and a second electrode. The first terminal of the first inductor is coupled to a first voltage terminal. The first terminal of the first switch is coupled to the second terminal of the first inductor via a first node. The second terminal of the first switch is coupled to a second voltage terminal. The first terminal of the diode is coupled to the first node. The first electrode of the first capacitor is coupled to the second terminal of the diode and the second electrode of the first capacitor is coupled to the output terminal.

Advantageously, the first inductor is coupled via a series circuit including the diode and the first capacitor to the output terminal. By setting the first switch in a conducting state, energy is stored in the first inductor. After setting the first switch in a non-conducting state, the stored energy is provided via the series circuit to the output terminal and generates an output voltage at the output terminal with a pulse.

According to an embodiment, a first supply voltage is tapped at the first voltage terminal and a second supply voltage is tapped at the second voltage terminal. In an example, a value of the first supply voltage is higher than a value of the second supply voltage.

According to an embodiment, the driver circuit comprises a second capacitor with a first and a second electrode. The first electrode of the second capacitor is coupled to the first terminal of the diode. The second electrode of the second capacitor is coupled to a third voltage terminal.

According to a further development, a third supply voltage is tapped at the third voltage terminal. In an example, a value of the first supply voltage and a value of the third supply voltage are equal.

According to an embodiment, the driver circuit comprises a further inductor that couples the first terminal of the diode to the first node.

According to an embodiment, the driver circuit comprises an additional inductor that couples the second terminal of the diode to the first electrode of the first capacitor.

According to an embodiment, the driver circuit comprises a control circuit coupled to a control terminal of the first switch. The control circuit is configured to set the first switch in a conducting state during a control duration. The control duration depends on at least one signal of a pulse-width-modulated signal and a trigger signal. The pulse-width-modulated signal and the trigger signal are provided to the control circuit.

According to an embodiment, the driver circuit comprises a second switch with a first and a second terminal. The first terminal of the second switch is coupled to the second electrode of the first capacitor. The second terminal of the second switch is coupled to a fourth voltage terminal. Thus, the first terminal of the second switch is coupled to the output terminal.

According to an embodiment, the first and/or the second switch are realized as a transistor, such as a field-effect transistor, abbreviated FET. The FET may be implemented as junction FET or metal-oxide-semiconductor FET or gallium nitride FET (abbreviated GaN FET). The transistor is a power transistor.

According to a further development, a fourth supply voltage is tapped at the fourth voltage terminal. In an example, a value of the fourth supply voltage is higher than a value of the first supply voltage and a value of the second supply voltage.

According to an embodiment, the driver circuit comprises a parallel resistor connected in parallel to the first capacitor. The parallel resistor couples the first electrode of the first capacitor to the second electrode of the first capacitor. Advantageously, the parallel resistor and the first capacitor contribute to pulse forming of the output voltage.

According to an embodiment, the driver circuit comprises a DC/DC converter that is coupled on its output side to at least one of the first to the fourth voltage terminal. The DC/DC converter can also be named DC-to-DC converter.

According to an embodiment, the DC/DC converter is configured to provide at least one of a first supply voltage at the first voltage terminal, a second supply voltage at the second voltage terminal and a fourth supply voltage at the fourth voltage terminal such that a value of the third supply voltage is higher than a value of the first supply voltage and a value of the first supply voltage is higher than a value of the second supply voltage.

According to an embodiment of the driver circuit, the control circuit is additionally coupled to a control terminal of the second switch. The control circuit is configured to set the second switch into a conducting state during a constant duration. A height of the pulse of the output voltage is independent from the constant duration.

According to an embodiment, a load is connected to the output terminal. The load couples the output terminal to a fifth voltage terminal.

According to an embodiment, an optical circuit comprises the driver circuit and a first number N of lasers that couple the output terminal to the fifth voltage terminal. A laser is realized as a semiconductor laser such as a laser diode. Thus, the load at the output terminal is realized by the first number N of lasers. Alternatively, the load is realized by at least one light emitting diode such as a single light emitting diode, a series circuit of light emitting diodes or a parallel circuit of light emitting diodes.

According to a further development, a fifth supply voltage is tapped at the fifth voltage terminal. In an example, a value of the fourth supply voltage and a value of the fifth supply voltage are equal. In an example, the DC/DC converter is coupled on its output side to the fifth voltage terminal.

According to an embodiment, a method for providing a pulse comprises setting a first switch in a conducting state, wherein the first switch couples a second terminal of a first inductor to a second voltage terminal and wherein a first terminal of the first inductor is coupled to a first voltage terminal. Moreover, the method comprises setting the first switch in a non-conducting state. The second terminal of the first inductor is coupled via a diode to a first electrode of a first capacitor and a second electrode of the first capacitor is coupled to an output terminal at which an output voltage with a pulse is provided.

The driver circuit and the optical circuit described above are particularly suitable for the method for providing a pulse. Features described in connection with the driver circuit and the optical circuit can therefore be used for the method and vice versa.

According to an embodiment of the method, the first switch is set in a conducting state during a control duration which depends on at least one signal of a pulse-width-modulated signal and a trigger signal. The height of the pulse of the output voltage increases with the value of the control duration.

According to an embodiment of the method, a second switch couples the second electrode of the first capacitor to a fourth voltage terminal. The second switch is set in a conducting state after a peak of the pulse of the output voltage. Thus, the second switch prevents disturbances such as ringing after the pulse of the output voltage.

According to an embodiment of the method, a parallel resistor is coupled in parallel circuit to the first capacitor. The parallel resistor and the first capacitor form an output filter or are parts of an output filter designed for shaping of the pulse of the output voltage.

According to an embodiment of the method, the output voltage is applied to a first number N of lasers. The pulse of the output voltage is provided to the first number N of lasers. The first number N of lasers emit light during the pulse.

According to an embodiment of the method, the first number N of lasers are attached to a laser pad to which a fifth supply voltage is applied. The fifth supply voltage is equal e.g. to a reference potential.

According to an embodiment, the optical circuit is realized as a multilaser driver plus DC-DC power supply. The driver circuit is configured to drive multichannel lasers simultaneously even in case of high bond wire inductance and varying forward voltages due to binning. The optical circuit fulfills e.g. high currents requirements. A current in a channel through a laser is e.g. higher than 40 A (e.g. for multichannel lasers). Advantageously, the driver circuit generates the output voltage and the laser current only with a small amount of noise and low jitter, and is electrically highly efficient. Jitter is a system concern for LIDAR applications. LIDAR is the abbreviation for "light detection and ranging". The driver circuit realizes e.g. a topology of floating potential laser bias used in conjunction with a non-switching power supply. The floating potential reduces a required applied potential across two points which are electrically isolated in the off state which requires much less challenging power supply design and is much safer and cheaper. Additionally, power is recaptured during the discharge phase, therefore the optical circuit is electrically much more efficient.

According to an embodiment, the design of the arrangement with the optical circuit uses a DC/DC converter which e.g. is not noisy, allows a more power efficient laser driver portion, is safer by eliminating a high potential, realizes a very high current source and provides an immediate value add to a user as there is no longer a need to use a step-up boost converter or expensive rack power supply. Additionally, this approach addresses forward voltage bin variation for diode lots (which may be another source of system performance inconsistency) as well as temperature variation which occurs during operation.

In an example, the optical circuit includes four channels which are driven by the driver circuit. The optical circuit overcomes bondwire inductance. Since the arrangement with the optical circuit is free of a switching power supply or buck-boost converter or expensive rack power supply, noise and system jitter are reduced. The arrangement is intended for high power LIDAR applications (automotive) for 4, 6, etc. channel laser bars. The driver circuit can be realized as a module used for driving multilaser LIDAR systems.

BRIEF DESCRIPTION OF THE DRAWINGS

The following description of figures of examples or embodiments may further illustrate and explain aspects of the driver circuit and the optical circuit and the method for providing a pulse. Arrangements, devices and circuit blocks with the same structure and the same effect, respectively, appear with equivalent reference symbols. In so far as arrangements, devices and circuit blocks correspond to one another in terms of their function in different figures, the description thereof is not repeated for each of the following figures.

FIGS. 1A to 1E show an exemplary embodiment of an optical circuit with a driver circuit;

DETAILED DESCRIPTION

Figure 1A:
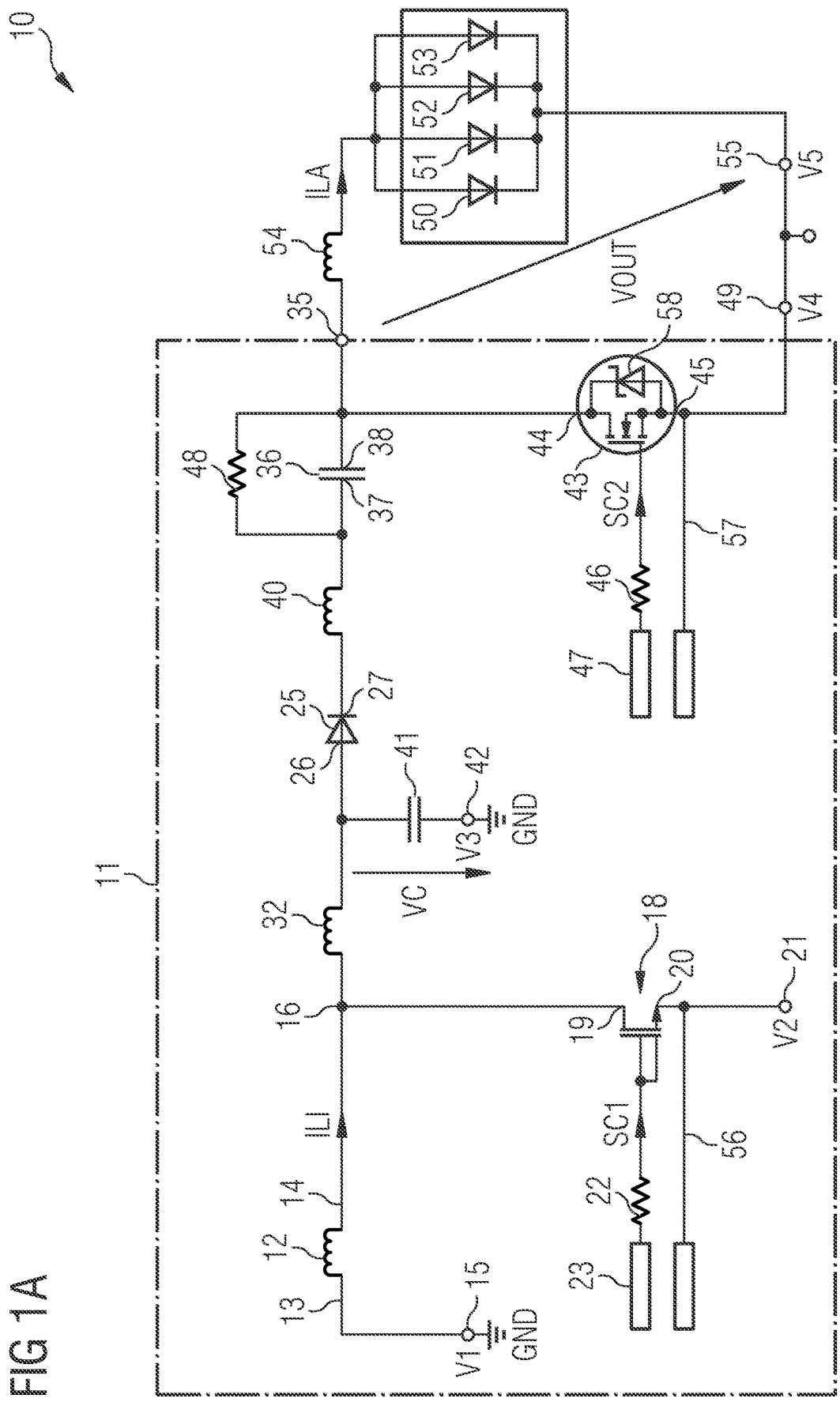

FIG. 1A shows an exemplary embodiment of an optical circuit 10 with a driver circuit 11. The driver circuit 11 comprises a first inductor 12 with a first and a second terminal 13, 14. The first terminal 13 of the first inductor 12 is coupled to a first voltage terminal 15. The second terminal 14 of the first inductor 12 is coupled to a first node 16. An inductance of the first inductor 12 is e.g. between 5 nH and 100 nH or between 10 nH and 50 nH. The driver circuit 11 comprises a first switch 18 with a first terminal 19 coupled to the first node 16 and a second terminal 20 coupled to a second voltage terminal 21. The driver circuit 11 includes a first control resistor 22 that couples a first control input 23 to a control terminal of the first switch 18. The first switch 18 is implemented e.g. as junction field-effect transistor, abbreviated as JFET. The first switch 18 is realized e.g. as a double gate transistor. The two gates are connected to each other. Alternatively, the first switch 18 is implemented as a single gate transistor.

Additionally, the driver circuit 11 includes a diode 25 with a first and a second terminal 26, 27. For example, the first terminal 26 of the diode 25 is realized as an anode of the diode 25 and the second terminal 27 of the diode 25 is realized as a cathode of the diode 25. The first terminal 26 of the diode 25 is coupled to the first node 16. The driver circuit 11 includes a further inductor 32 which couples the first node 16 to the first terminal 26 of the diode 25.

The driver circuit 11 has an output terminal 35. The output terminal 35 is coupled to the second terminal 27 of the diode 25. The driver circuit 11 includes a first capacitor 36 with a first and a second electrode 37, 38. The first electrode 37 of the first capacitor 36 is coupled to the second terminal 27 of the diode 25. The second electrode 38 of the first capacitor 36 is coupled to the output terminal 35. The first capacitor 36 has a capacitance between 10 nF and 500 nF or between 50 nF to 200 nF. The driver circuit 11 may include an additional inductor 40 that is arranged between the second terminal 27 of the diode 25 and the first electrode 37 of the first capacitor 36. The additional inductor 40 is implemented by an inductor such as a coil or by parasitic inductances of the connection lines and/or bonding wires between the diode 25 and the first capacitor 36. Additionally, the driver circuit 11 comprises a second capacitor 41 that couples the first terminal 26 of the diode 25 to a third voltage terminal 42. The third voltage terminal 42 is connected to the first voltage terminal 15. A first electrode of the second capacitor 41 is directly connected to the first terminal 26 of the diode 25. A capacitance value of the second capacitor 41 is less than a capacitance value of the first capacitor 36.

The driver circuit 11 comprises a second switch 43 having a first and a second terminal 44, 45. The first terminal 44 of the second switch 43 is coupled to the second electrode 38 of the capacitor 36. The driver circuit 11 includes a parallel resistor 48 that connects the second electrode 38 of the first capacitor 36 to the first electrode 37 of the first capacitor 36. A terminal of the parallel resistor 48 is coupled to the output terminal 35 and also to the first terminal 44 of the second switch 43. Another terminal of the parallel resistor 48 is coupled to the second terminal 27 of the diode 25, e.g. via the additional inductor 40. The second terminal 45 of the second switch 43 is coupled to a fourth voltage terminal 49. The second switch 43 couples the output terminal 35 to the fourth voltage terminal 49. The second switch 43 includes a transistor, such as a field-effect transistor. The field-effect transistor is manufactured e.g. using as material one of silicon (abbreviated Si), silicon carbide (SiC), gallium arsenide (GaAs), gallium nitride (GaN), and indium gallium arsenide (InGaAs). The second switch 43 is realized e.g. as a metal oxide semiconductor field-effect transistor, abbreviated as MOSFET. The second switch 43 is implemented e.g. as an n-channel MOSFET.

The second switch 43 includes a further diode 58 that couples the first terminal 44 of the second switch 43 to the second terminal 45 of the second switch 43. The anode of the further diode 58 is connected to the second terminal 45 of the second switch 43. The cathode of the further diode 58 is connected to the first terminal 44 of the second switch 43. The further diode 58 is realized e.g., as an internal body diode or behavioral diode of the transistor of the second switch 43. The further diode 58 is e.g. an intrinsic feature of the FET of the second switch 43. The further diode 58 may have the function of a Zener diode.

Alternatively, the further diode 58 is implemented as a separate device. Thus, the second switch 43 includes the further diode 58 and the transistor described above.

The driver circuit 11 comprises a second control resistor 46 that couples a second control input 47 to a control terminal of the second switch 43. The second terminal 20 of the first switch 18 and the second terminal 45 of the second switch 43 may be connected by additional connection lines 56, 57. Alternatively, these additional connection lines are omitted.

The optical circuit 10 includes the driver circuit 11 and at least a laser 50. The laser 50 is fabricated as a laser 10 diode. The optical circuit 10 may include a first number N of lasers 50 to 53, e.g. a first number N of laser diodes 50 to 53. In the example shown in FIG. 1A, the first number N is four. Alternatively, the first number N of lasers 50 to 53 may be one, two, three or larger than four. The first number N of lasers 50 to 53 are connected in parallel. Thus, each of the first number N of lasers 50 to 53 couples the output terminal 35 to a fifth voltage terminal 55. As shown in FIG. 1A, the fifth voltage terminal 55 is connected to the fourth voltage terminal 49. The optical circuit 10 includes an inductance 54 that couples the output terminal 35 to the first number N of lasers 50 to 53. The inductance 54 is realized as parasitic inductance, e.g. resulting from a bonding wire and conducting lines between the first capacitor 36 and the first number N of lasers 50 to 53. Alternatively, the inductance 54 is realized as an inductor, e.g. as a coil.

The optical circuit 11 is free of a regulated current source or a regulated current sink coupling the first number N of lasers 50 to 53 to the output terminal 35, to the second electrode 38 of the first capacitor 36 or to the fifth supply terminal 55. Advantageously, an energy loss in such a current sink or current source is avoided.

A first supply voltage V1 is provided to the first voltage terminal 15. A third supply voltage V3 is provided to the third voltage terminal 42. The first and the third supply voltages V1, V3 may be equal. For example, the first supply voltage V1 is implemented as a reference potential GND.

A second supply voltage V2 is applied to the second voltage terminal 21. The second supply voltage V2 is negative with respect to the first supply voltage V1. The second supply voltage V2 is negative with respect to the reference potential GND. In an example, the second supply voltage V2 is −36 V.

A fourth supply voltage V4 is applied to the fourth voltage terminal 49. A fifth supply voltage V5 is applied to the fifth voltage terminal 55. The fourth and/or the fifth supply voltage V4, V5 are positive with respect to the first supply voltage V1. In an example, the fourth and the fifth supply voltage V4, V5 are equal. In an example, the fourth supply voltage V4 has the value +36 V. An output voltage VOUT is provided between the output terminal 35 and the fifth voltage terminal 55.

The schematic of the optical circuit 10 shown in FIG. 1A includes only four lasers 50 to 53 being driven, but can be increased for any 4×N number of channels. In FIG. 1A, a four piece monolithic cut from die is illustrated. 4×N for increasing channel is possible.

The laser driver portion operates using the steps: The first switch 18 switches on; power is applied and energy is stored in the first inductor 12; the first switch 18 is switched off; the field of the first inductor 12 collapses and discharges through the lasers 50 to 53 (all four lasers).

The parallel resistor 48 and the first capacitor 36 are tuned for optimal energy transfer from the first inductor 12 to the lasers 50 to 53. The second switch 43 provides signal conditioning and prevents "ringing".

Typical values are:
inductance of the first inductor 12: 17 nH,
inductance of the further inductor 32: 100 pH,
inductance of the additional inductor 40: 1 nH,
value of the inductance 54: 1 nH, capacitance of the first capacitor 36: 100 nF
capacitance of the second capacitor 41: 5 nF
resistance of the first control resistor 22: 100 Ohm
resistance of the second control resistor 46: 100 Ohm
possible type of the diode 25: SiC diode
possible type of the first switch 18: GS665160
possible type of the second switch 43: EPC 2053 or GS61008T In an example, the driver circuit 11 includes an RLC circuit. The RLC circuit includes at least one of the first capacitor 36, the second capacitor 41, the parallel resistor 48, the first inductor 12, the further inductor 32 and the additional 25 inductor 40. The RLC values above are for the charging to be in resonance with the discharge via the lasers 50 to 53. These values are only examples. Other values could also be appropriate. The transistor of the first switch 18 provides the pathway to charge the RLC circuit. The transistor of the 30 second switch 43 prevents the lasers 50 to 53 from continuing to discharge by providing a path to ground or to the fourth voltage terminal 49.

In a non-limiting example, the optical circuit 10 has the following features: The supply is fixed and uses e.g. +36 V/−36 V. The power is time-controlled. The driver circuit 11 uses a single switch. The laser current can have a peak value of 175 A. The optical power P (optical) is between 460 W and 640 W. An electrical energy used per pulse Win (electrical) is 95 µJ. An energy of the laser WLaser (electrical) is 22 µJ. A value of the energy losses WLosses (electrical) is 73 µJ. A value of the power of the losses PLosses is 12 W (using the driver circuit 11 at 162 kHz). An efficiency η is 22% energy recovery.

In an alternative embodiment, not shown, the additional inductor 40 is omitted and replaced by a conducting line.

Figure 1B:
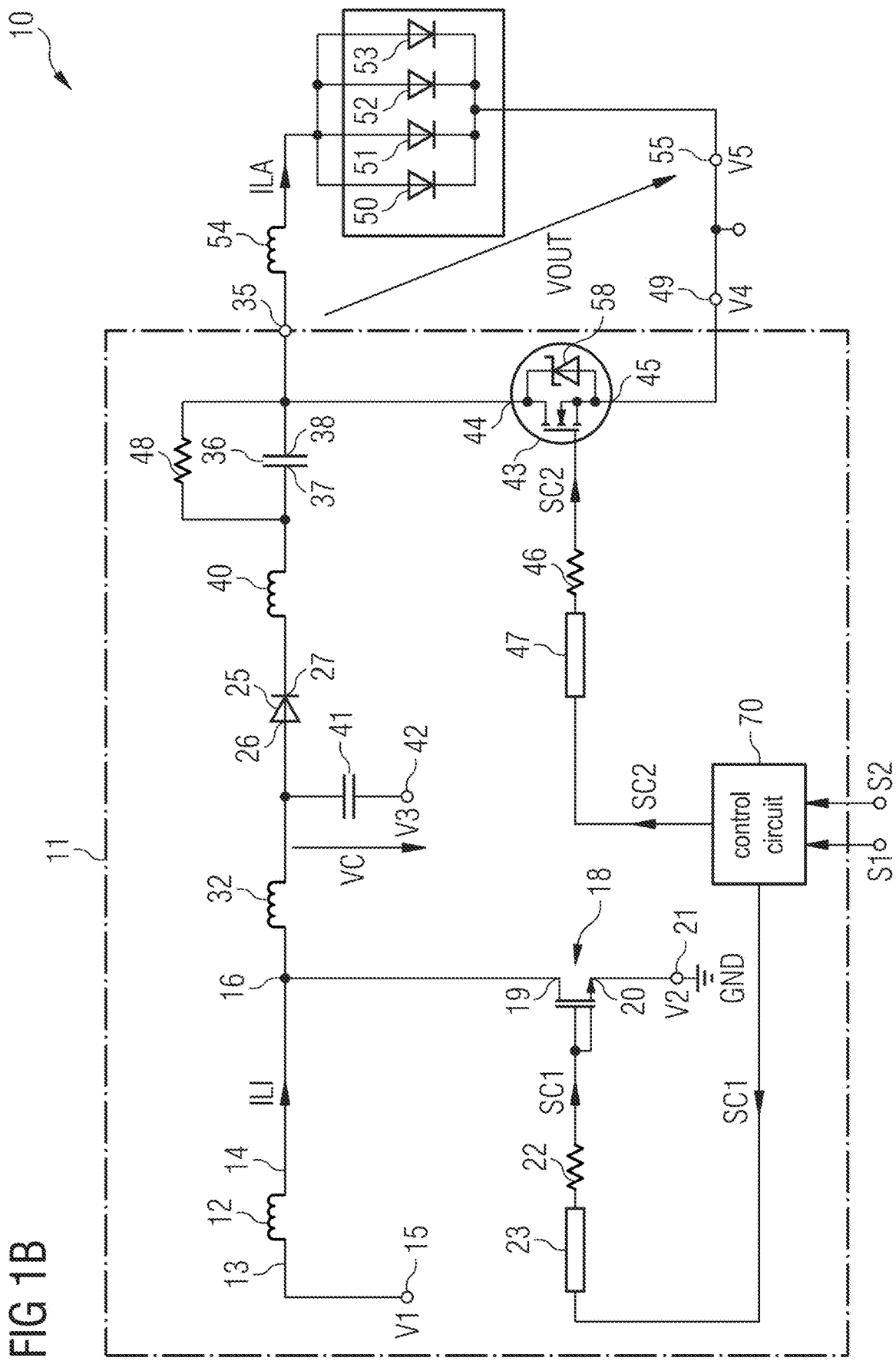
Figure 1D:
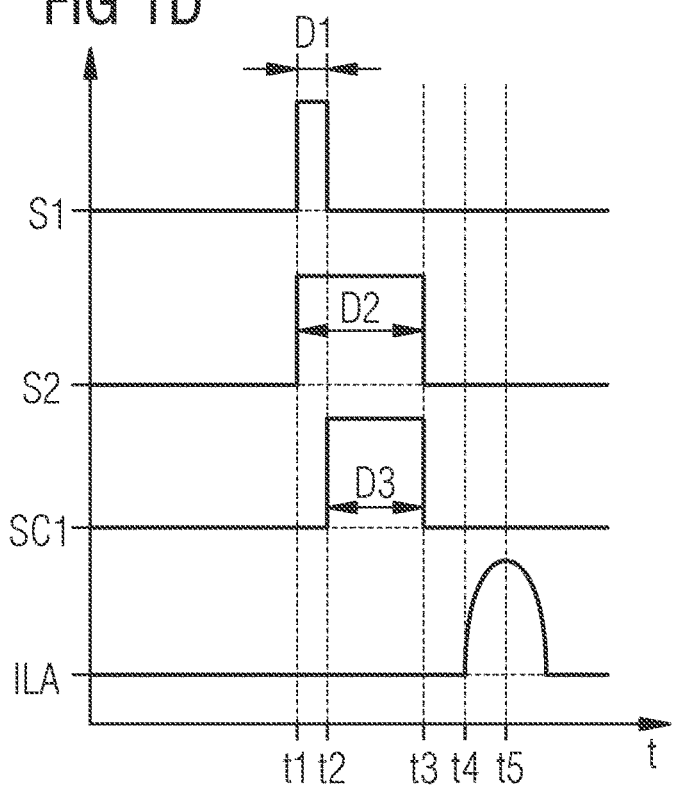
Figure 1E:
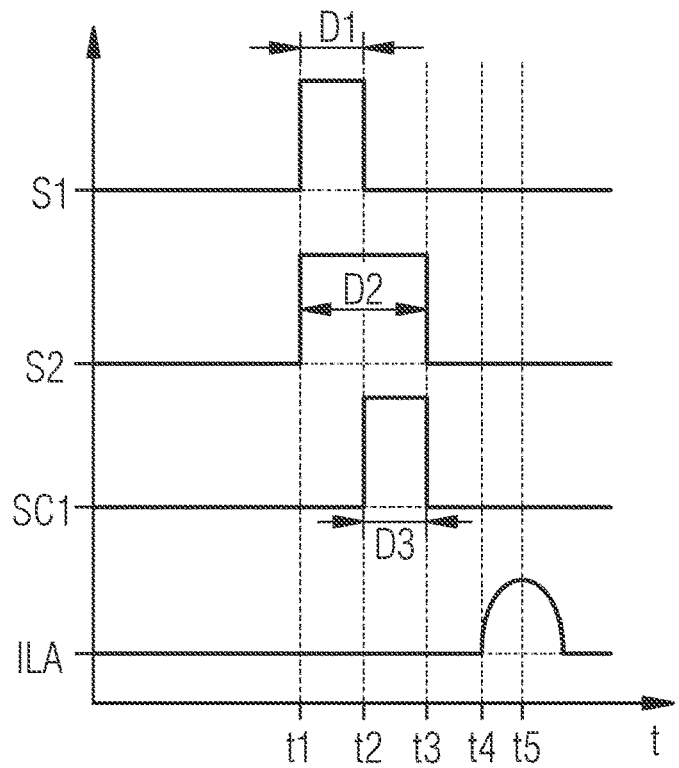

The operation of the driver circuit 11 and of the optical circuit 10 is explained in detail using FIG. 1C to 1E.

FIG. 1B shows a further exemplary embodiment of the optical circuit 10 which is a further development of the embodiment shown in FIG. 1A. The driver circuit 11 includes a control circuit 70 having a first output connected to the first control input 23. A second output of the driver circuit 11 is connected to the second control input 47. The control circuit 70 includes at least two inputs. The control circuit 70 receives a pulse-width-modulated signal S1 and a trigger signal S2. The pulse-width-modulated signal S1 can also be named PWM signal. PWM is the abbreviation for pulse-width-modulation or pulse-width-modulated. The control circuit 70 generates a first control signal SC1 that is applied to the control terminal of the first switch 18. Furthermore, the control circuit 70 provides a second control signal SC2 that is applied to the control terminal of the second switch 43.

In FIG. 1B, the supply voltages provided to the five voltage terminals are changed in comparison to the voltages shown in FIG. 1A. The first supply voltage V1 is a negative voltage with respect to the reference potential GND, such as e.g. −36 V. The third supply voltage V3 is equal to the first supply voltage V1. Alternatively, the third supply voltage V3 is equal to the second supply voltage V2.

The second supply voltage V2 that is applied to the second voltage terminal 21 is a negative voltage, e.g. −72 V.

The fourth supply voltage V4 is equal to the reference potential GND. The fourth supply voltage V4 is higher than the first supply voltage V1. The fifth supply voltage V5 is equal to the fourth supply voltage V4. Thus, the fifth supply voltage V5 is higher than the first supply voltage V1.

Thus, the levels of the supply voltages at the five voltage terminals are shifted by 36 V in comparison to the voltage levels shown in FIG. 1A.

Alternatively, the fifth supply voltage V5 is equal to the first supply voltage V1, the second supply voltage V2 or the third supply voltage V3.

FIG. 1C shows examples of signals of the optical circuit 10 as shown in FIG. 1A. The signals are shown as a function of a time t. In FIG. 1C, the PWM signal S1, the trigger signal S2, the first and the second control signal SC1, SC2, a laser current ILA, an inductor current ILI, and a capacitor voltage VC are shown. The laser current ILA flows through the number N of lasers 50 to 53. Thus, the laser current ILA is the sum of the currents flowing through the first number N of lasers 50 to 53. The inductor current ILI flows through the first inductor 12. The capacitor voltage VC can be tapped between the first and the second electrode of the second capacitor 41.

The optical circuit 10 is in an idle state before a first point of time t1. Between the first point of time t1 and a second point of time t2, the PWM signal S1 shows a pulse. The trigger signal S2 shows a pulse between the first point of time t1 and a third point of time t3. The third point of time t3 follows the second point of time t2.

Before the second point of time t2, the first switch 18 is in a non-conducting state. Thus, both electrodes of the second capacitor 42 are coupled to the reference potential GND. Therefore, the capacitor voltage VC across the second capacitor 41 has the value 0 V. The inductor current ILI and the laser current ILA have the value 0 Ampere.

The first control signal SC1 shows a pulse between the second point of time t2 and the third point of time t3. At the second point of time t2, the first control signal SC1 sets the first switch 18 in a conducting state. This results in an 25 increase of the inductor current ILI. Typically the rise of the inductor current ILI is linear. After the second point of time t2, the capacitor voltage VC falls to the value of the second supply voltage V2. Thus, between the second point of time and the third point of time the first switch 18 provides 30 the second voltage V2 to the first electrode of the second capacitor 41.

At the third point of time t3, the first control signal SC1 sets the first switch 18 in a non-conducting state. The high value of the inductor current ILI provides charge to the first electrode of the second capacitor 41 and to the first electrode 37 of the first capacitor 36. Thus, the capacitor voltage VC rises. The increase of the voltage at the first electrode 37 of the first capacitor 36 results in an increase of the voltage at the second electrode 38 of the first capacitor 36 after the third point of time t3.

After the fourth point of time t4, the capacitor voltage VC has a peak and the inductor current ILI decreases. The lasers 50 to 53 have a threshold. At the fourth point of time t4, the output voltage VOUT across the first number N of lasers 50 to 53 is higher than the threshold resulting in a start of a pulse of the laser current ILA flowing through the first number N of lasers 50 to 53. Thus, the laser current ILA has a pulse form.

At a fifth point of time t5, the laser current ILA and the capacitor voltage VC have a peak. The peak value of the capacitor voltage VC results in an inductor current ILI that is negative for a short time after the fifth point of time t5. Since the first number N of lasers 50 to 53 consume energy which is mainly stored by the first capacitor 36 and the stored energy has a limited value, the laser current ILA drops. Thus, the form of the pulse or peak of the laser current ILA is also a function of the characteristics of the first number N of lasers 50 to 53 and of the value of the first number N.

At a sixth point of time t6, the second control signal SC2 has a pulse. The sixth point of time t6 is after the fifth point of time t5. The sixth point of time t6 is set when the pulse of the laser current ILA has been finished. The second control signal SC2 sets the second switch 43 in a conducting state. Thus, the fourth supply voltage V4 is applied to the second electrode 38 of the second capacitor 36. The output voltage VOUT is set on the value of the fourth supply voltage V4. Therefore, a voltage value at the second electrode 38 of the first capacitor 36 is stabilized and any disturbances, such as oscillations, which may result in a further rise or further pulse of the laser current IL are avoided.

The recapturing of energy during a discharge phase is achieved by switching the second switch 43 in a conducting state. During the discharge phase, the first inductor 12 provides energy to other circuit parts of the optical circuit 10. The discharge phase starts at the third point of time t3. Thus, energy is provided to the fourth voltage terminal 49.

The driver circuit 11 includes a pulse forming network that couples the first node 16 to the output terminal 35. The pulse forming network comprises the diode 25 and the first capacitor 36. The first capacitor 36 has the effect that a DC current flow is hindered in the direction towards the output terminal 35, but an AC current flow is achieved in the direction towards the output terminal 35. The diode 25 is oriented such that the AC current flows only in the direction towards the output terminal 35. Optionally, the pulse forming network also comprises at least one of the additional inductor 40, the further inductor 32, the second capacitor 41 and the inductance 54.

FIGS. 1D and 1E show two exemplary embodiments of signals of the optical circuit 10 shown in FIG. 1A which are a further development of the signals shown in FIG. 1C. A pulse of the PWM signal S1 has a first duration D1. A pulse of the trigger signal S2 has a second duration D2.

In an example, the second duration D2 is kept constant and is equal in FIGS. 1D and 1E. In FIG. 1D, the first duration D1 is shorter than the first duration D1 shown in FIG. 1E.

A pulse of the first control signal SC1 has a control duration D3. The control duration D3 can be calculated:

$$D3=D2-D1$$

In FIG. 1C, the control duration D3 has a higher value in comparison to the control duration D3 of FIG. 1E. The higher value of the control duration D3 results in a higher value of energy stored in the first inductor 12 and thus in a higher value of energy provided via the diode 25 and the first capacitor 36 to the output terminal 35 and consequently in a higher value of the laser current ILA. Therefore, in FIG. 1D a high power situation and in FIG. 1E a low power situation are shown.

The first, third and fourth points of time t1, t3, t4 are fixed. The power is controlled by the second point of time 25 t2. The delay between a rising-edge of the trigger signal S2 to the laser current ILA is constant. The first, second, third and sixth points of time t1, t2, t3, t6 are set, e.g. by the control circuit 70 or a not-shown controller that provides the PWM signal S1 and the trigger signal S2 to the 30 control circuit 70.

Figure 2A:
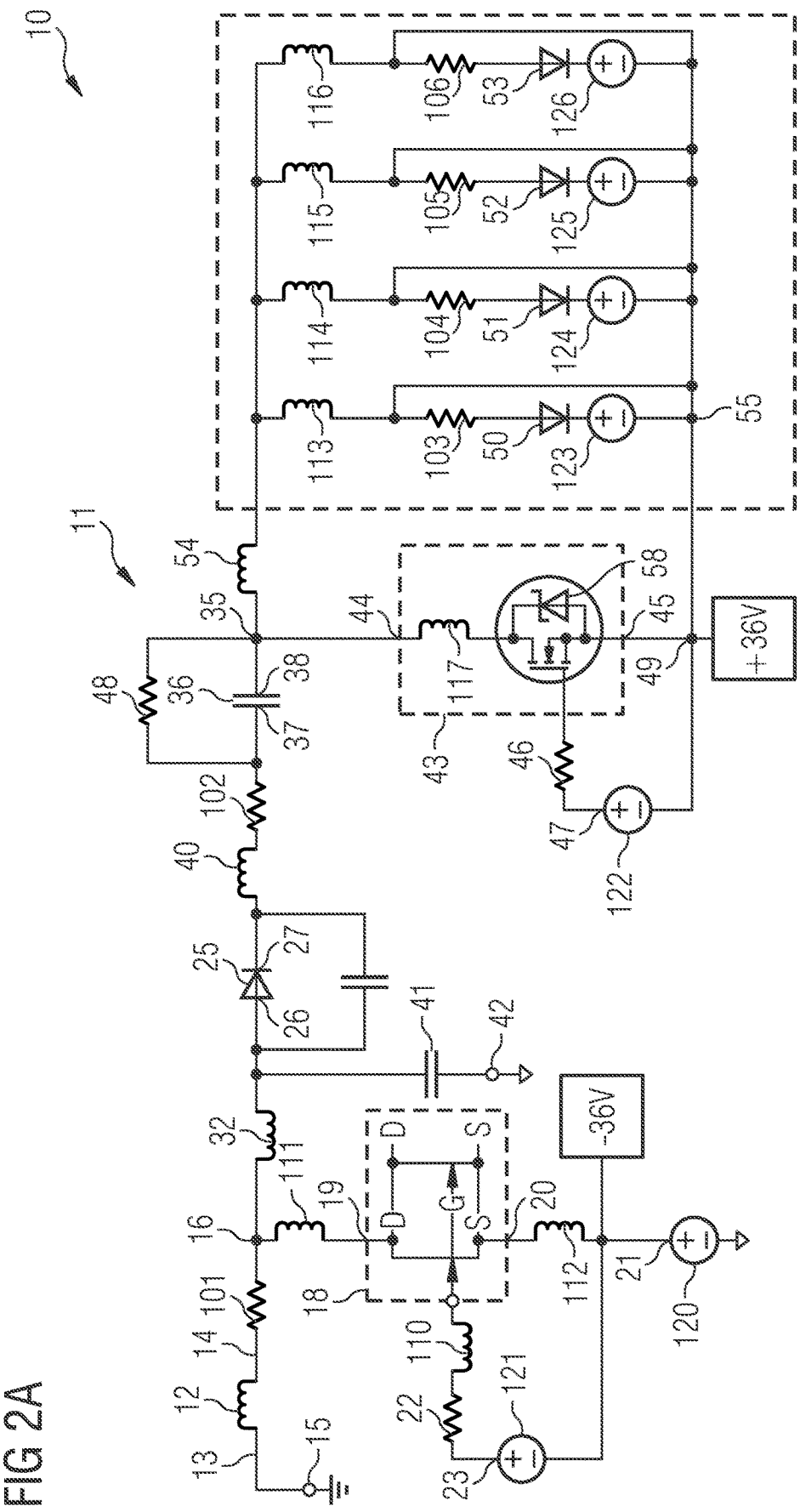
FIGS. 2A and 2B show an exemplary embodiment of an optical circuit with a driver circuit in the form of a simulation circuit and of simulation results.

FIG. 2A shows an exemplary embodiment of a simulation circuit of the optical circuit 10 as shown in FIG. 1A. The first switch 18 may be realized as a gallium nitride semiconductor switch, abbreviated GaN switch, or as a GaN field-effect transistor. The second switch 43 is implemented as shut-off switch. The first number N of lasers 50 to 53 can be named quad laser. For the simulation the following devices are additionally introduced into the circuit: a first to a sixth resistor 101 to 106, a second to a ninth inductor 110 to 117 and a first to a seventh voltage source 120 to 126.

Figure 2B:
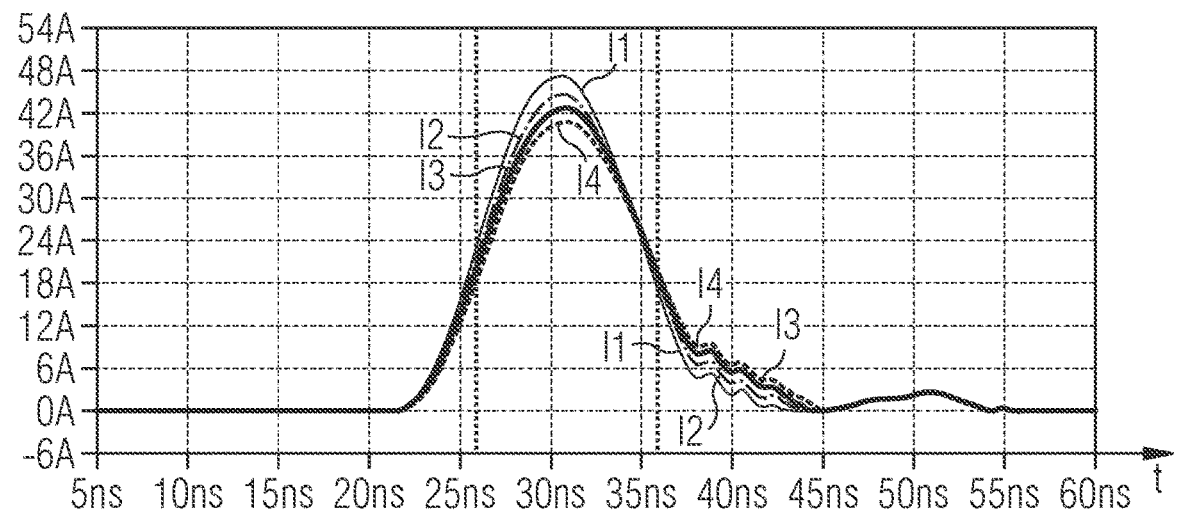
Figure 2B:
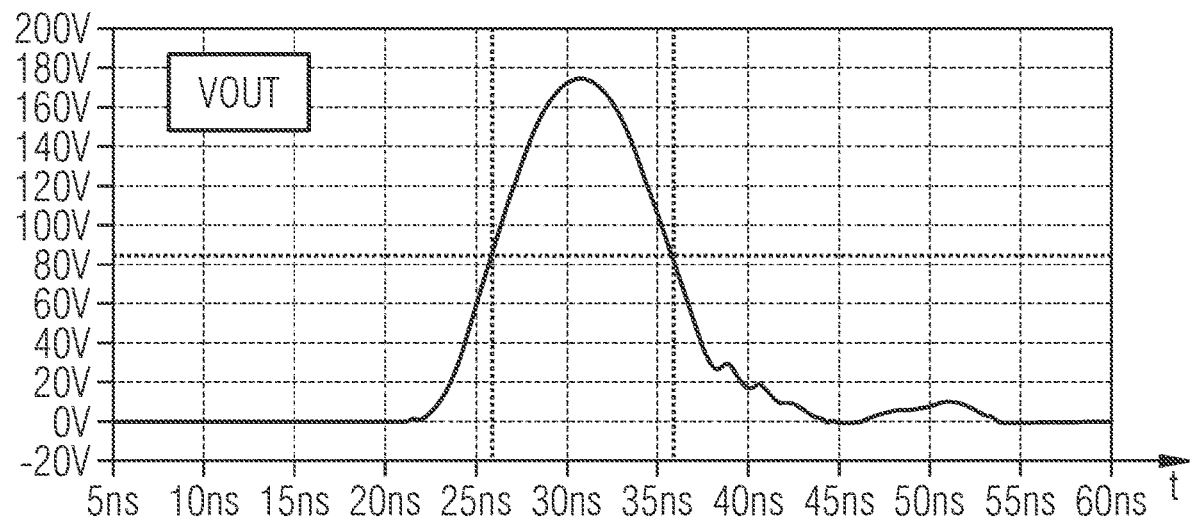

FIG. 2B shows exemplary simulation results achieved with the simulation circuit of FIG. 2A. In the upper part of FIG. 2B, four laser currents I1 to I4 flowing through the four lasers 50 to 53 are shown. The laser current ILA is the sum of the currents I1 to I4. The values of the four currents I1 to I4 only have a small deviation from each other. The simulations show that varying forward voltages are tolerated without issue, and a response time is e.g. less than 1 ns.

The output voltage VOUT is shown in the lower part of FIG. 2B. The duration of the peak is about 10 nanoseconds. The four lasers 50 to 53 achieve their peak current values approximately at the same point of in time. The increase and the drop of the laser currents I1 to I4 of the four lasers 50 to 53 has a high parallelism.

Figure 3A:
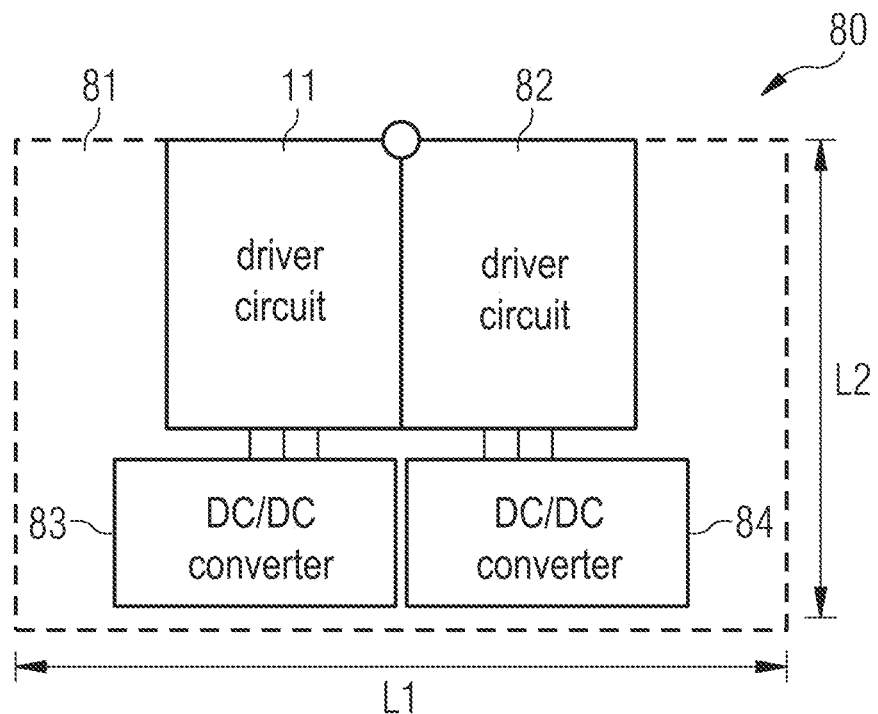
FIGS. 3A to 3C show exemplary embodiments of arrangements with an optical circuit.

FIG. 3A shows an exemplary embodiment of an arrangement 80 with the driver circuit 11 which is a further development of the embodiments shown above. The arrangement 80 includes a printed circuit board 81. The printed circuit board 81 has a first and a second side length L1, L2. A typical value for the first side length L1 is e.g. 80 mm and a typical value of the second side length L2 is e.g. 50 mm. The arrangement 80 includes the driver circuit 11 as explained above and a further driver circuit 82 which is realized such as the driver circuit 11. Additionally, the arrangement 80 includes a DC/DC converter 83 and a further DC/DC converter 84. The DC/DC converter 83 is coupled to the driver circuit 11. The further DC/DC converter 84 is coupled to the further driver circuit 82. The DC/DC converter 83, the further DC/DC converter 84, the driver circuit 11 and the further driver circuit 82 are attached on the printed circuit board 81.

The DC/DC converter 83 provides the first to the fifth supply voltages V1 to V5 to the driver circuit 11. The further DC/DC converter 84 provides further first to fifth supply voltages V1 to V5 to the further driver circuit 82.

In an example, the arrangement 80 includes the first number N of lasers 50 to 53 (not shown in FIG. 3A) connected to the driver circuit 11. The arrangement 80 additionally includes a second number M of lasers (not shown in FIG. 3A) connected to the further driver circuit 82. The first number N of lasers 50 to 53 and the second number M of lasers can operate in parallel or at separate times.

Figure 3B:
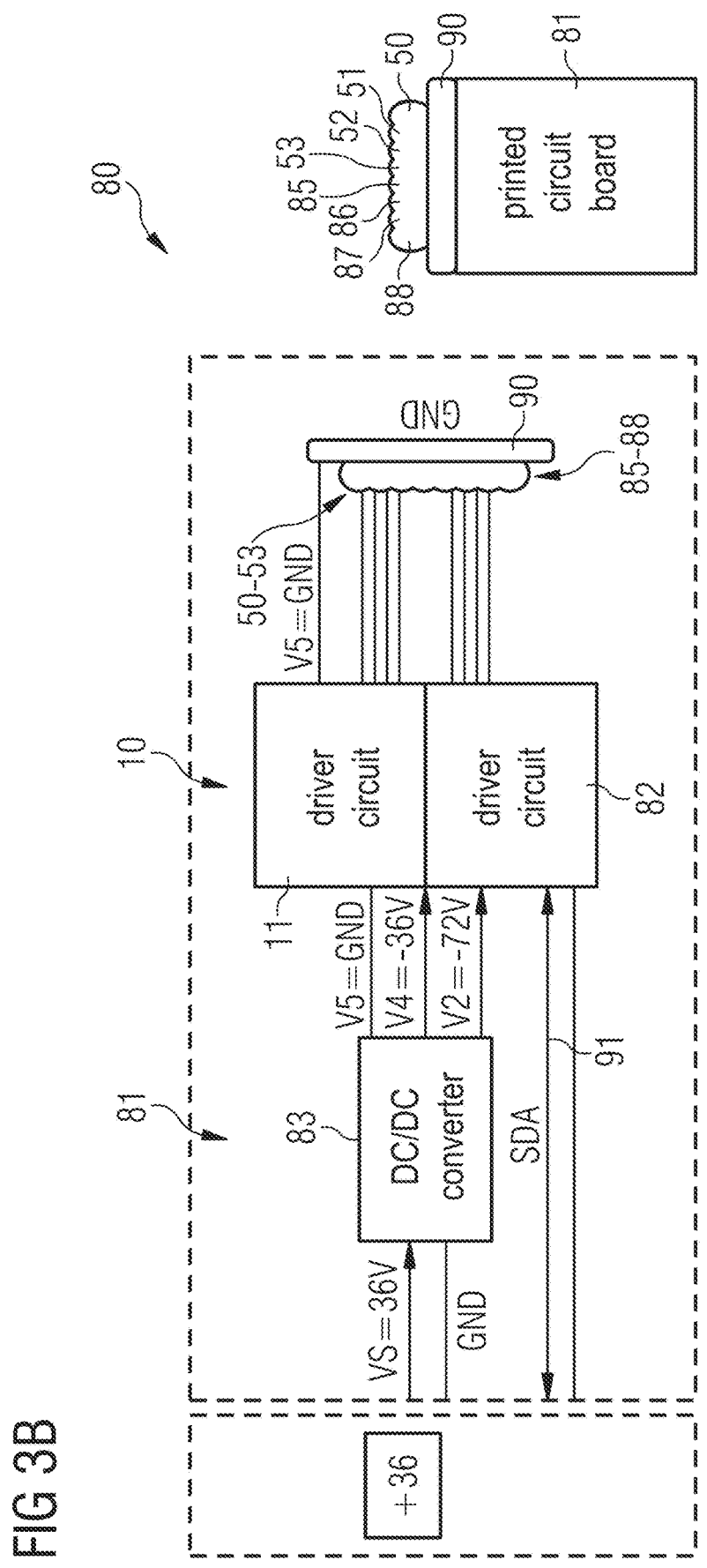

FIG. 3B shows an alternative embodiment of the arrangement 80 which is a further development of the above shown embodiments. The arrangement 80 comprises the DC/DC converter 83, the driver circuit 11, the further driver circuit 82, the first number N of lasers 50 to 53 and the second number M of lasers 85 to 88. The first number N of lasers 50 to 53 and the second number M of lasers 85 to 88 are realized on a common laser pad 90. The DC/DC converter 83, the driver circuit 11, the further driver circuit 82 and the common laser pad 90—including the first number N of lasers 50 to 53 and the second number M of lasers 85 to 88—are attached to the printed circuit board 81.

The arrangement 80 includes a data connection line 91 providing a data signal SDA to and/or from the driver circuit 11. The data signal SDA on the data connection line 91 may include the PWM signal S1 and the trigger signal S2. The data connection line 91 is connected to the control circuit 70 of the driver circuit 11. Additionally, the data connection line 91 provides the data signal SDA also to and/or from the further driver circuit 82. The connection line 91 is connected to a control circuit of the further driver circuit 82.

On the input side the DC/DC converter 83 receives a supply voltage VS. The supply voltage VS is positive. The supply voltage VS may have the value of 36 V. The DC/DC converter 83 generates the first to the fifth supply voltages V1 to V5 such as is shown in FIG. 1B. Thus, the first supply voltage V1 is a negative voltage, such as e.g. −36 V. The third supply voltage V3 is equal to the first supply voltage V1. The second supply voltage V2 is a negative voltage, such as e.g. −72 V. The fifth supply voltage V5 is equal to the reference potential GND. The fifth supply voltage V5 is equal to the fourth supply voltage V4.

The fifth supply voltage V5 is supplied to the laser pad 90. Advantageously, in FIG. 3B the laser pad 90 is on the value of the reference potential GND.

Figure 3C:
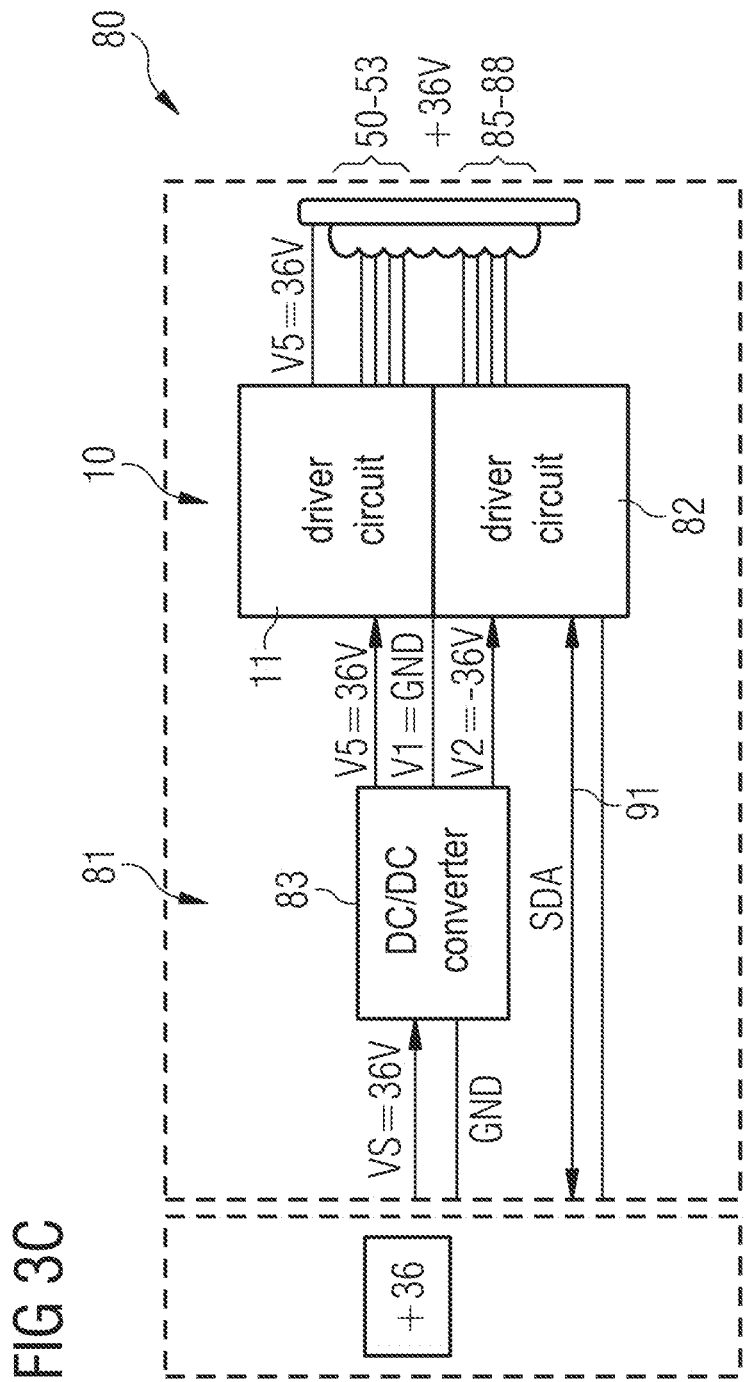

FIG. 3C shows an alternative embodiment of the arrangement 80 which is a further development of the embodiments shown above. In FIG. 3C, the values of the supply voltages V1 to V5 as shown in FIG. 1A are used. Thus, the first supply voltage V1 is equal to the reference potential GND. The third supply voltage V3 is equal to the first supply voltage V1. The second supply voltage V2 is a negative voltage, such as e.g. −36 V. The fifth supply voltage V5 is a positive voltage, such as e.g. +36 V. The fifth supply voltage V5 is equal to the fourth supply voltage V4.

Since the laser pad 90 obtains the value of the fifth supply voltage V5, the laser pad 90 is connected to 36 V. The maximum value of voltages is lower in the arrangement 80 shown in FIG. 3C. However, according to FIG. 3C, the laser pad 90 of the lasers is constantly on the value of the fifth supply voltage V5 which may be 36 V, even in time periods in which the lasers 50 to 53 are not used.

In the example of FIG. 3C, the laser pad 90 is at 36 V, whereas in the example of FIG. 3B the laser pad 90 is at the reference potential GND. Thus, there are at least two options for selecting appropriate supply voltages V1 to V5 which can be chosen according to the circumstances.

In an example, the optical circuit 10 realizes some of the following features such as a single switch topology, an energy recovery system, a high efficiency, a time-controlled power, a simple power supply +/−36 V, a laser pad being not grounded (+36 V) in FIG. 3C, a total loss 15 W and/or a diode reverse voltage being zero (not firing).

The DC/DC converter 83 and/or the further DC/DC converter 84 provide voltages e.g. between 36 V to −36 V DC/DC and could be realized e.g. by off the shelf parts. An example for the DC/DC converter 83 and the further DC/DC converter 84 could be device LTC7820 from Analog Devices Inc. The arrangement 80 implements a DC/DC fixed supply, with e.g. an output power Pout=166.42 W, an input power Pin=162.9 W and an efficiency η=98%.

In an example, typical values of the optical circuit 10 could be:
Input voltage: 36 V
Input inductance: 18 nH
Laser inductance: 1 nH
Parallel capacitance: 6 nF
Forward voltage of the laser 50:4 V
Laser resistance: 160 mOhm
Timing of the trigger signal S2 (called laser trigger signal) 80 ns
Forward voltage of series diode 25:2 V
GaN inductance: 300 pH
Temperature: 60 degree C.
Diode thermal runaway: no issue.

In an example, the arrangement 80 is implemented as a LIDAR arrangement. The LIDAR arrangement is used e.g. in a vehicle such as an autonomous vehicle. The first number N of lasers 50 to 53 and/or the second number M of lasers may be fabricated as infrared lasers, e.g. emitting light at 905 nm or 1550 nm.

The invention is not limited to the description of the embodiments. Rather, the invention comprises each new feature as well as each combination of features, particularly each combination of features of the claims, even if the feature or the combination of features itself is not explicitly given in the claims or embodiments.

The invention claimed is:

1. A driver circuit comprising:
a first inductor comprising a first terminal coupled to a first voltage terminal;
a first switch comprising a first terminal and a second terminal, wherein the first terminal of the first switch is coupled to a second terminal of the first inductor via a first node and the second terminal of the first switch is coupled to a second voltage terminal;
a diode comprising a first terminal coupled to the first node;
an output terminal;
a first capacitor comprising a first electrode coupled to a second terminal of the diode and a second electrode coupled to the output terminal; and
a control circuit coupled to a control terminal of the first switch and configured to set the first switch in a conducting state during a control duration which depends on at least one signal of a pulse-width-modulated signal and a trigger signal.

2. The driver circuit of claim 1,
wherein the driver circuit further comprises a second capacitor with a first electrode and a second electrode, wherein the first electrode of the second capacitor is coupled to the first terminal of the diode and the second electrode of the second capacitor is coupled to a third voltage terminal.

3. The driver circuit of claim 1,
wherein the driver circuit further comprises a further inductor that couples the first terminal of the diode to the first node.

4. The driver circuit of claim 1,
wherein the driver circuit further comprises an additional inductor that couples the second terminal of the diode to the first electrode of the first capacitor.

5. The driver circuit of claim 1, wherein the driver circuit further comprises a parallel resistor connected in parallel to the first capacitor.

6. A method for providing a pulse, wherein the method comprises:
setting a first switch into a conducting state, wherein the first switch couples a second terminal of a first inductor to a second voltage terminal; and wherein a first terminal of the first inductor is coupled to a first voltage terminal; and
setting the first switch into a non-conducting state, wherein the second terminal of the first inductor is coupled via a diode to a first electrode of a first capacitor and a second electrode of the first capacitor is coupled to an output terminal at which an output voltage with a pulse is provided; and
setting the first switch into a conducting state during a control duration which depends on at least one signal of a pulse-width-modulated signal and a trigger signal.

7. The method of claim 6,
wherein a second switch couples the second electrode of the first capacitor to a fourth voltage terminal and is set into a conducting state after a peak of the pulse of the output voltage.

8. The method of claim 6,
wherein the output voltage is applied to a first number N of lasers.

9. The method of claim 8,
wherein the first number N of lasers are attached to a laser pad to which a reference potential is provided.

10. A driver circuit comprising:
a first inductor comprising a first terminal coupled to a first voltage terminal;
a first switch comprising a first terminal and a second terminal, wherein the first terminal of the first switch is coupled to a second terminal of the first inductor via a first node and the second terminal of the first switch is coupled to a second voltage terminal;
a diode comprising a first terminal coupled to the first node;
an output terminal;
a first capacitor comprising a first electrode coupled to a second terminal of the diode and a second electrode coupled to the output terminal;
a second capacitor with a first electrode and a second electrode, wherein the first electrode of the second capacitor is coupled to the first terminal of the diode and the second electrode of the second capacitor is coupled to a third voltage terminal; and
a second switch with a first terminal and a second terminal, wherein the first terminal of the second switch is coupled to the second electrode of the first capacitor and the second terminal of the second switch is coupled to a fourth voltage terminal.

11. The driver circuit of claim 10, wherein the driver circuit further comprises a parallel resistor connected in parallel to the first capacitor.

12. The driver circuit of claim 10, wherein the driver circuit further comprises a DC/DC converter coupled on its output side to at least one of the first terminal, the second terminal, and the fourth voltage terminal.

13. The driver circuit of claim 12,
wherein the DC/DC converter is configured to provide at least one of a first supply voltage at the first voltage terminal, a second supply voltage at the second voltage terminal, and a fourth supply voltage at the fourth voltage terminal such that a value of the fourth supply voltage is higher than a value of the first supply voltage and a value of the first supply voltage is higher than a value of the second supply voltage.

14. An optical circuit comprising:
the driver circuit of claim 10; and
a first number N of lasers that couple the output terminal to a fifth voltage terminal.

\* \* \* \* \*